United States Patent [19]
Shin et al.

[11] Patent Number: 5,737,276
[45] Date of Patent: Apr. 7, 1998

[54] MEMORY DEVICE WITH FAST EXTENDED DATA OUT (EDO) MODE AND METHODS OF OPERATION THEREFOR

[75] Inventors: Sang-Gil Shin, Seoul; Kyung-Woo Kang, Kyungki-do, both of Rep. of Korea

[73] Assignee: Samsung Electronics Co., Ltd., Suwon, Rep. of Korea

[21] Appl. No.: 712,499

[22] Filed: Sep. 11, 1996

[30] Foreign Application Priority Data

Sep. 11, 1995 [KR] Rep. of Korea ............... 29572/1995

[51] Int. Cl.$^6$ ................................................ G11C 8/00
[52] U.S. Cl. ................. 365/230.08; 365/203; 365/235; 365/238.5
[58] Field of Search ................ 365/189.05, 230.08, 365/235, 238.5, 203

[56] References Cited

U.S. PATENT DOCUMENTS

| | | | |
|---|---|---|---|
| 5,436,865 | 7/1995 | Kitazawa | 365/194 |
| 5,457,659 | 10/1995 | Schaefer | 365/222 |
| 5,532,961 | 7/1996 | Mori et al. | 365/189.05 |
| 5,610,864 | 3/1997 | Manning | 365/193 |

*Primary Examiner*—David C. Nelms
*Assistant Examiner*—Hien Nguyen
*Attorney, Agent, or Firm*—Myers Bigel Sibley & Sajovec

[57] ABSTRACT

A memory device having normal and extended data out (EDO). modes includes an array of memory cells arranged in plurality of rows and columns, first and second data latches which store data, a column address input which receives a column address signal, and a column address strobe input which receives a column address strobe signal. First latch control means, responsive to said column address input and to the column address strobe input, electrically couples one memory cell in the array of memory cells and the first data latch when a column address signal is asserted at the column address input and electrically decouples the one memory cell and the first data latch when a column address strobe signal is asserted at the column address strobe input, thereby latching data present in the one memory cell prior to assertion of the column address strobe signal in the first data latch. Second latch control means, responsive to the column address strobe input, electrically couples the first data latch and the second data latch when a column address strobe signal is asserted at the column address strobe input and electrically decouples the first data latch and the second data latch when a column address strobe signal is deasserted at the column address strobe input, thereby latching data present in the first data latch prior to deassertion of the column address strobe signal in the second data latch.

11 Claims, 4 Drawing Sheets

5,737,276

MEMORY DEVICE WITH FAST EXTENDED DATA OUT (EDO) MODE AND METHODS OF OPERATION THEREFOR

FIELD OF THE INVENTION

The present invention relates to integrated circuit devices, in particular, to integrated circuit memory devices.

BACKGROUND OF THE INVENTION

Improving the performance of a dynamic random access memory (DRAM) device typically involves reducing the time required to access data stored in the device. One way of reducing access time is to make the output path between the memory cells of the device as short as possible. However, in highly integrated devices with complex structures, the extent to which output paths can be shortened typically is limited. For this reason, other techniques for decreasing access time in DRAMs have been developed.

As typical DRAMs are accessed by multiplexing a sequence of data bits on a single data output line, extended data out (EDO) access techniques aim to increase the speed at which sequences of bits are output from the device. Portions of a DRAM having an EDO access mode are illustrated in FIG. 1. In general, in order to retrieve data from a memory device, data from columns of a memory cell array 200 are read while enabling a single row or word line WL, with the data output from memory cells 12, 22 of the array 200 being time-multiplexed at a device data output DOUT. To read data stored in a memory cell 12, a row address strobe (RAS) signal transitions, strobing a row address into the device and activating a word line WL of the memory array 10. After the transition of the RAS signal, cells in the selected row are read by sequentially accessing bit line pairs BLi/$\overline{BLi}$, BLj/$\overline{BLj}$, under control of a column address strobe (CAS) signal. Thus, in a typical read operation, several transitions of the CAS signal will occur for each cycle of the RAS signal.

In greater detail, bit lines BLi/$\overline{BLi}$, BLj/$\overline{BLj}$ initially are at the same voltage level before a memory access. When a row address is established after an enabling transition of the RAS signal, the word line WL corresponding to the row address is selected, coupling the memory cells 12, 22 to the bit lines BLi, BLj, thereby transferring charge between the memory cells 12, 22 and the bit lines BLi, BLj. This results in the generation of a voltage differences between the bit line pairs BLi/$\overline{BLi}$, BLj/$\overline{BLj}$. P-type and n-type sense amplifiers 14, 24, 16, 26 sense and amplify these voltage differences, forcing one of the bit lines of a given pair BLi/BLi' towards the positive power supply voltage of the memory device and forcing the other bit line of the pair to the ground voltage of the memory device with the polarity of the bit lines being determined by the voltages stored within the memory cells 12, 14. As soon as a column address is set up, a column select signal CSL is generated which drives the gates of select transistors 18, 20, and thus transfers the voltage between the bit lines BLi/$\overline{BLi}$, BLj/$\overline{BLj}$ to input output lines IOi/$\overline{IOi}$, IOj/$\overline{IOj}$. The voltage between the input/output lines IOi/$\overline{IOi}$, IOj/$\overline{IOj}$ is then sensed and amplified by an input/output sense amplifier 34.

Additional control signals PFDBSi0/PFDBSiB0, PFDBSi1/PFDBSiB1 are then enabled upon transition of the CAS signal, loading data from one of the memory cells 12, 22 through the input/output sense amplifier 34 into a latch 40 via gate 38 based on the column address. Data stored in the latch is output at the data output DOUT of the device via a repeater 42 and an output buffer 44. The output buffer 44 typically is capable of tri-state operation under the control of a data output enable signal PTRST.

Because of the presence of the latch 40, the EDO DRAM can offer speed improvement over conventional fast page mode DRAMs which typically require that the column address be maintained until data is read from the output buffer 44. In the EDO DRAM, however, once data is stored in the latch 40, a new column address cycle can be initiated without affecting the data available at the output pin DOUT, allowing data retrieval from the output DOUT and setup of a new column address by recycling the CAS signal. Thus, the cycle of the CAS signal may be shortened and access time decreased. Despite the speed improvements offered by the EDO technique, however, additional improvement in access speed for DRAMs is desirable.

SUMMARY OF THE INVENTION

In light of the foregoing, it is an object of the present invention to provide memory devices and methods of operation therefor which allow faster data access.

This and other objects, features and advantages are provided by memory devices and methods of operation therefor in which an array of memory cells is accessed by asserting a column address signal to electrically couples one of the memory cells to a first data latch, asserting a column address strobe signal to couple the first data latch to a second data latch and to decouple the one memory cell and the first data latch such that data from the memory cell is latched in the first data latch, and deasserting the column address strobe signal to decouple the first data latch and the second data latch such that data from the first data latch is latched in the second data latch. In an extended data out (EDO) mode, a second column address signal may then be asserted to couple a second memory cell to the first data latch while data from the first memory cell is read from the second data latch. Because the first data latch may be set up before assertion of the column address strobe signal, the present invention can provide faster access than conventional DRAMs which select a memory cell output after asserting a column address strobe signal.

In particular, according to the present invention, a memory device includes an array of memory cells which store data, the memory cells of the array arranged in a plurality of rows and columns, a first data latch which stores data, a second data latch which stores data, a column address input which receives a column address signal, and a column address strobe input which receives a column address strobe signal. First latch control means, responsive to the column address input and to the column address strobe input, electrically couple one memory cell in the array of memory cells and the first data latch when a column address signal is asserted at the column address input and electrically decouples the one memory cell and the first data latch when a column address strobe signal is asserted at the column address strobe input, thereby latching data present in the one memory cell prior to assertion of the column address strobe signal in the first data latch. Second latch control means, responsive to the column address strobe input, electrically couples the first data latch and the second data latch when a column address strobe signal is asserted at the column address strobe input and electrically decouples the first data latch and the second data latch when a column address strobe signal is deasserted at the column address strobe input, thereby latching data present in the first data latch prior to deassertion of the column address strobe signal in the second data latch.

Preferably, the first latch control means includes a first bit line electrically connected to the one memory cell, a second bit line, means for amplifying a voltage between the first and second bit lines to thereby produce a voltage corresponding to data stored in the one memory cell, and a gate, responsive to the column address input and to the column address strobe input and having an input electrically connected to the amplifying means and an output electrically connected to the first data latch, which electrically couples the amplifying means and the first data latch when a column address signal is asserted at the column address input and which electrically decouples the amplifying means and the first data latch when a column address strobe signal is asserted at the column address input. The second latch control means preferably includes a gate, responsive to the column address strobe input and having an input electrically connected to the first data latch and an output electrically connected to the second data latch, which electrically couples the first data latch and the second data latch when a column address strobe signal is asserted at the column address strobe input and which electrically decouples the first data latch and the second data latch when the column address strobe signal is deasserted at the column address strobe input. The memory device also preferably includes a data output and a data output buffer electrically connected to the second data latch and to the data output and having a data output enable input, the data output buffer electrically coupling the second data latch to the data output when an enable signal is asserted at the data output enable input.

According to an extended data out (EDO) method aspect, a first column address signal is asserted to electrically couple the first data latch and one memory cell in one row of the array of memory cells. A column address strobe signal is then asserted to electrically couple the first data latch and the second data latch and to electrically decouple the one memory cell and the first data latch, thereby latching data present in the one memory cell prior to assertion of the column address strobe signal in the first data latch. The column address strobe signal is then deasserted to electrically decouple the first data latch and the second data latch, thereby latching data present in the first data latch prior to deassertion of the column address strobe signal in the second data latch. To initiate a new access cycle, following assertion of the column address strobe signal, a second column address signal is asserted to electrically couple the first data latch and a second memory cell in the one row of memory cells. Following assertion of the second column address signal, the column address strobe signal is reasserted to electrically couple the first data latch and the second data latch and to electrically decouple the second memory cell and the first data latch, thereby latching data present in the second memory cell prior to reassertion of the column address strobe signal in the first data latch. The column address strobe signal is then deasserted to electrically decouple the first data latch and the second data latch, thereby latching data present in the first data latch prior to deassertion of the column address strobe signal in the second data latch. Preferably, the data is read from the second latch prior to reasserting the column address strobe signal, thereby providing an EDO access operation.

According to a normal access method aspect, a first column address signal is asserted to electrically couple one memory cell in one row of the array of memory cells and the first data latch. A column address strobe signal is then asserted to electrically couple the first data latch and the second data latch and to electrically decouple the one memory cell and the first data latch, thereby latching data present in the one memory cell prior to assertion of the column address strobe signal in the first data latch. Data is then read data from the second data latch while continuing to assert the column address strobe signal. To start a new cycle, the column address strobe signal is deasserted to electrically decouple the first data latch and the second data latch. A second column address signal is then asserted to electrically couple a second memory cell in the one row of memory cells and the first data latch, and the column address strobe signal reasserted to electrically couple the first data latch and the second data latch and to electrically decouple the second memory cell and the first data latch, thereby latching data present in the second memory cell prior to reassertion of the column address strobe signal in the first data latch. Data is then read from the second data latch while continuing to assert the column address strobe signal.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
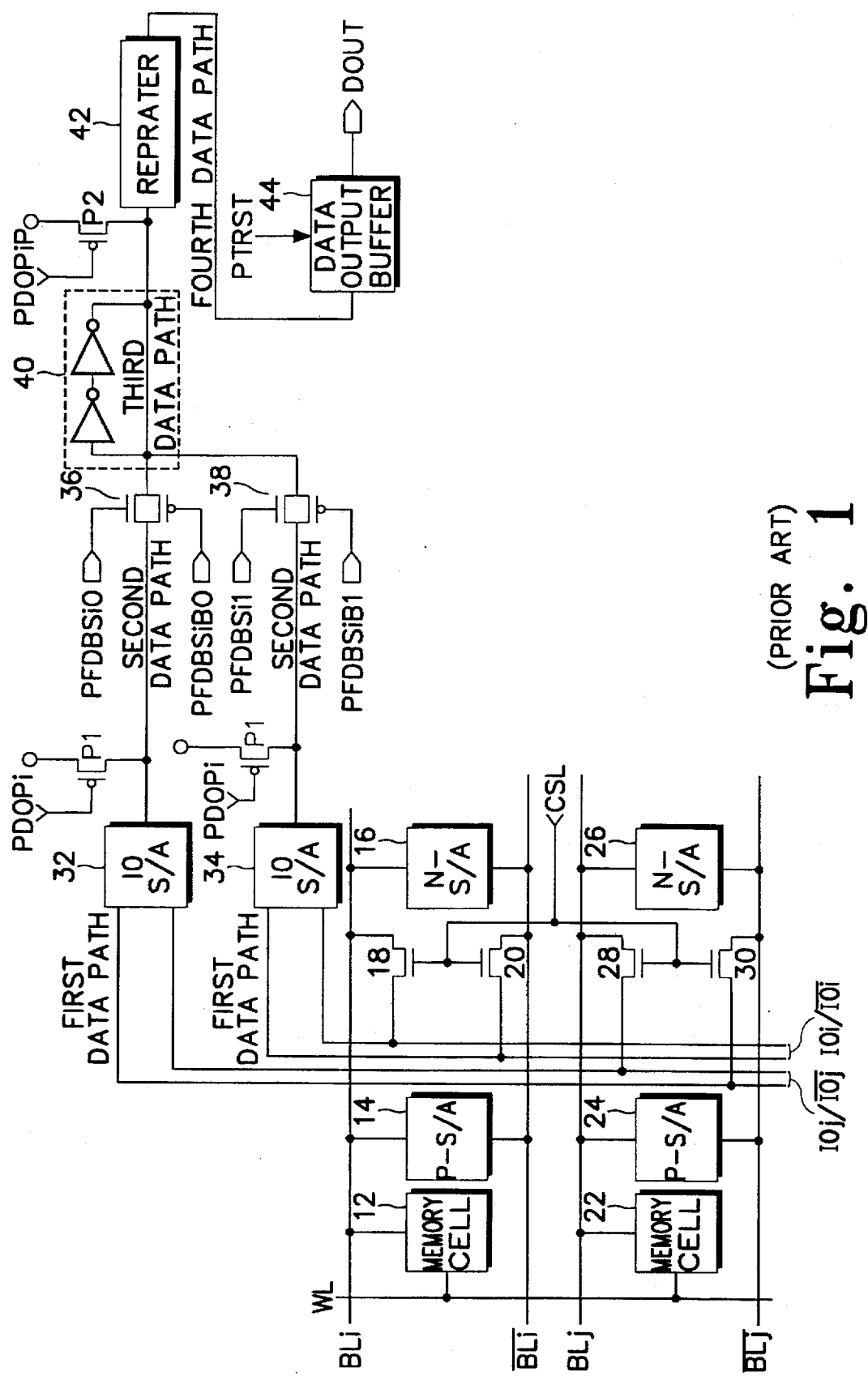
FIG. 1 is a schematic diagram illustrating an extended data out (EDO) memory device according to the prior art.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Figure 2:
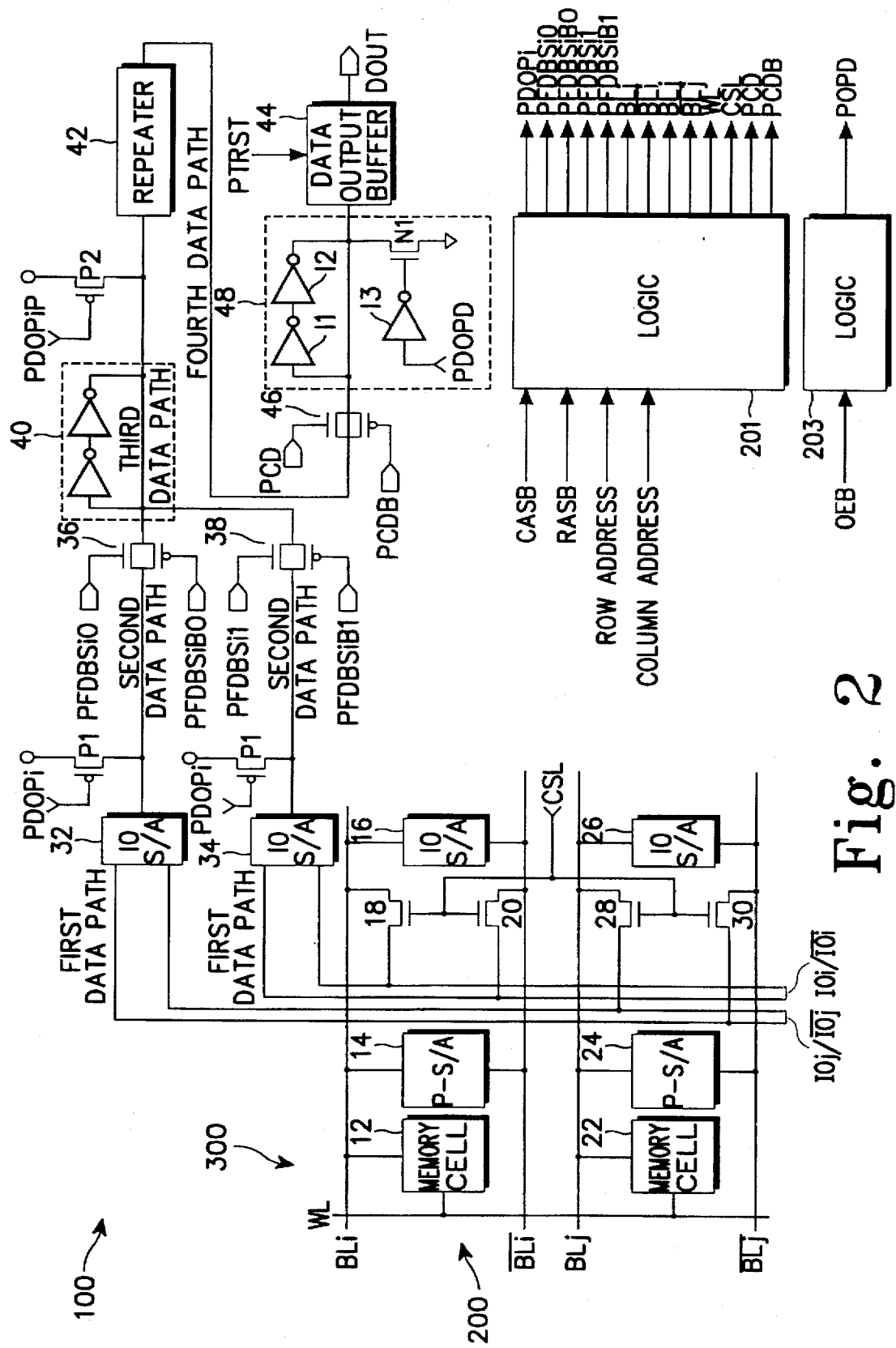
FIG. 2 is a schematic diagram illustrating a fast access memory device according to the present invention.

A memory device 100 according to the present invention is illustrated in FIG. 2. An array of memory cells 200 includes a row 300 including memory cells 12, 22 connected to a word line WL. Bit lines $BLi/\overline{BLi}$, $BLj/\overline{BLj}$ are shown connected to the memory cells 12, 22. P-type and n-type sense amplifiers 14, 24, 16, 26 amplify voltage differences between the bit line pairs $BLi/\overline{BLi}$, $BLj/\overline{BLj}$. Select transistors 18, 28, 20, 30 connect the bit line pairs $BLi/\overline{BLi}$, $BLj/\overline{BLj}$ to data lines $IOi/\overline{IOi}$, $IOj/\overline{IOj}$ in response to a column select signal CSL, thus transferring data from the memory cells 12, 22 to input/output sense amplifiers 32, 34. Gates 36, 38 connect the input/output sense amplifiers 32, 34 to a first data latch 40, under control of gate signals PFDBSi0/PFDBSiB0, PFDBSi1/PFDBSiB1. The first data latch 40 is in turn connected to a second data latch 48, via a repeater 42 and a gate 46 controlled by a gate control signal PCD/PCDB. The second data latch 48 is connected to a data output buffer 44 which drives a data output DOUT, under tristate control of a data output enable signal PTRST.

Still referring to FIG. 2, a first data path transmits data from the bit line pairs $BLi/\overline{BLi}$, $BLj/\overline{BLj}$ to the data lines $IOi/\overline{IOi}$, $IOj/\overline{IOj}$, a second data path is loaded by the input/output sense amplifiers 32,34, a third data path is selected by the gates 36,38, and a fourth data path passes through the repeater 42 and the data output buffer 44 to the data output DOUT. PMOS transistors P1,P2 precharge the second and third data paths by action of precharge signals PDOPI and PDOPiP. The second data latch 48 includes inverters I1,I2 connected in series, and an NMOS transistor 1 which receives a control signal PDOPD via a third inverter 13. The gate control signals PCD/PCDB are responsive to a column address strobe signal CASB, for example, via logic 201 while the control signal PDOPD is responsive to an output enable signal OEB supplied to the memory device, for example, via logic 203.

In detail, in response to assertion of a row address signal ROW ADDRESS and assertion of a row address strobe (RAS) signal RASB, a word line WL is selected, thus enabling data transfer from the memory cells 12, 22 in the row 300 to the bit lines BLi, BLj. The p-type and N-type sense amplifiers 16, 26, 14, 24 amplify voltage differences between the bit line pairs BLi/BLi, BLj/BLj. These row addressing and sense amplifying operations are well-known to those skilled in the art, and need not be discussed in further detail herein. For example, various row address related control signals such as the word line WL may be generated from the row address signal ROW ADDRESS and RAS signal RASB using logic 201.

In conjunction with word line WL, bit lines BLi/BLi, BLj/BLj, select transistors 18, 20, 28, 30, data lines IOi/IOi, IOj/IOj, and sense amplifiers 14, 24, 16, 26, 32, 34, the gates 36, 38 and the control signals associated therewith provide first latch control means for electrically coupling one of the memory cells 12, 22 in the row 300 in the array 200 and the first data latch 40 when a column address signal COLUMN ADDRESS is asserted, and for decoupling the one memory cell 12 when column address strobe (CAS) signal CASB is asserted. In response to assertion of a column address signal COLUMN ADDRESS, a column select signal CSL is activated, electrically coupling the bit line pairs BLi/BLi-BLj/BLj and data lines IOi/IOi, IOj/IOj, thereby enabling data transfer between the bit line pairs BLi/BLi-BLj/BLj, data lines IOi/IOi-IOj/IOj, and input/output sense amplifiers 32, 34. Those skilled in the art will appreciate that, as is commonly done in memory devices, the row address signal ROW ADDRESS and the column address signal COLUMN ADDRESS may be multiplexed on a common address bus. In addition, one of the gates 36, 38 is selected by assertion of a gate control signal PFDBSi0/PFDBSiB0 based on the column address supplied, thus electrically coupling the input output sense amplifier 32 to the first data latch 40, and enabling data transfer therebetween. Those skilled in the art will also appreciate that the column addressing related control signals such as the gate control signal PFDBSi0/PFDBSiB0 may be generated from the column address signal COLUMN ADDRESS and the CAS signal CASB in a number of commonly known ways, for example, by using logic 201.

The gate 46 serves as part of second latch control means for electrically coupling the first data latch 40 and the second data latch 48 when the CAS signal CASB is asserted and for decoupling the first data latch 40 and the second data latch 48 when the CAS signal CASB is deasserted. Upon assertion of a CAS signal CASB, gate control signal PCD/PCDB is asserted, electrically coupling the first data latch 40 and the second data latch 48, thereby enabling data transfer from the first data latch 40 to the second data latch 48 and on to the output buffer 44 via the repeater 42. The assertion of the CAS signal CASB also acts to electrically decouple the one memory cell 12 and the first data latch 40, such that data present in the one memory cell 12 prior to assertion of the CAS signal CASB is transferred to and remains in the first data latch 40 after assertion of the CAS signal CASB. Those skilled in the art will understand that although the CAS signal CASB typically is asserted by transition of the signal from a logic "high" state to a logic "low" state in a so-called "active low" configuration, complementary logic implementations may be used with the present invention.

In the EDO mode, the CAS signal CASB is then deasserted to electrically decouple the first data latch 40 and the second data latch 48 such that data present in the first data latch 40 prior to deassertion of the CAS signal CASB is latched in the second data latch 48. After latching of data into the second data latch 48, a new column address signal may be asserted without affecting the output DOUT of the data output buffer 44. Thus, after deassertion of the CAS signal CASB, data may be read from the second data latch 48 via the data output buffer 44 while a new column address is selected and data output of the corresponding memory cell is amplified by the input/output sense amplifiers, saving time over conventional EDO devices which select a memory cell and amplify data in a selected cell after assertion of the CAS signal CASB. In the non-EDO "normal" mode, data is read from the output DOUT while the CAS signal CASB is being asserted. Thus, while the CAS signal CASB is asserted, the gate control signal PCD/PCDB is also asserted, making the second data latch 40 transparent and allowing the contents of the first data latch to be read from the output buffer 44 under control of the data output enable signal PTRST.

In the preferred embodiment described above, the gates 36,38 transmit data from the first data path to the fourth data path in response to assertion of the column address signal COLUMN ADDRESS, prior to assertion of the CAS signal CASB. In the EDO mode, the gate 46 is switched by the CAS signal CASB, thus offering an access time reduction of 3 to 4 nanoseconds over conventional EDO devices. In the normal mode, the gate 46 is maintained in a transparent state.

Figure 3:
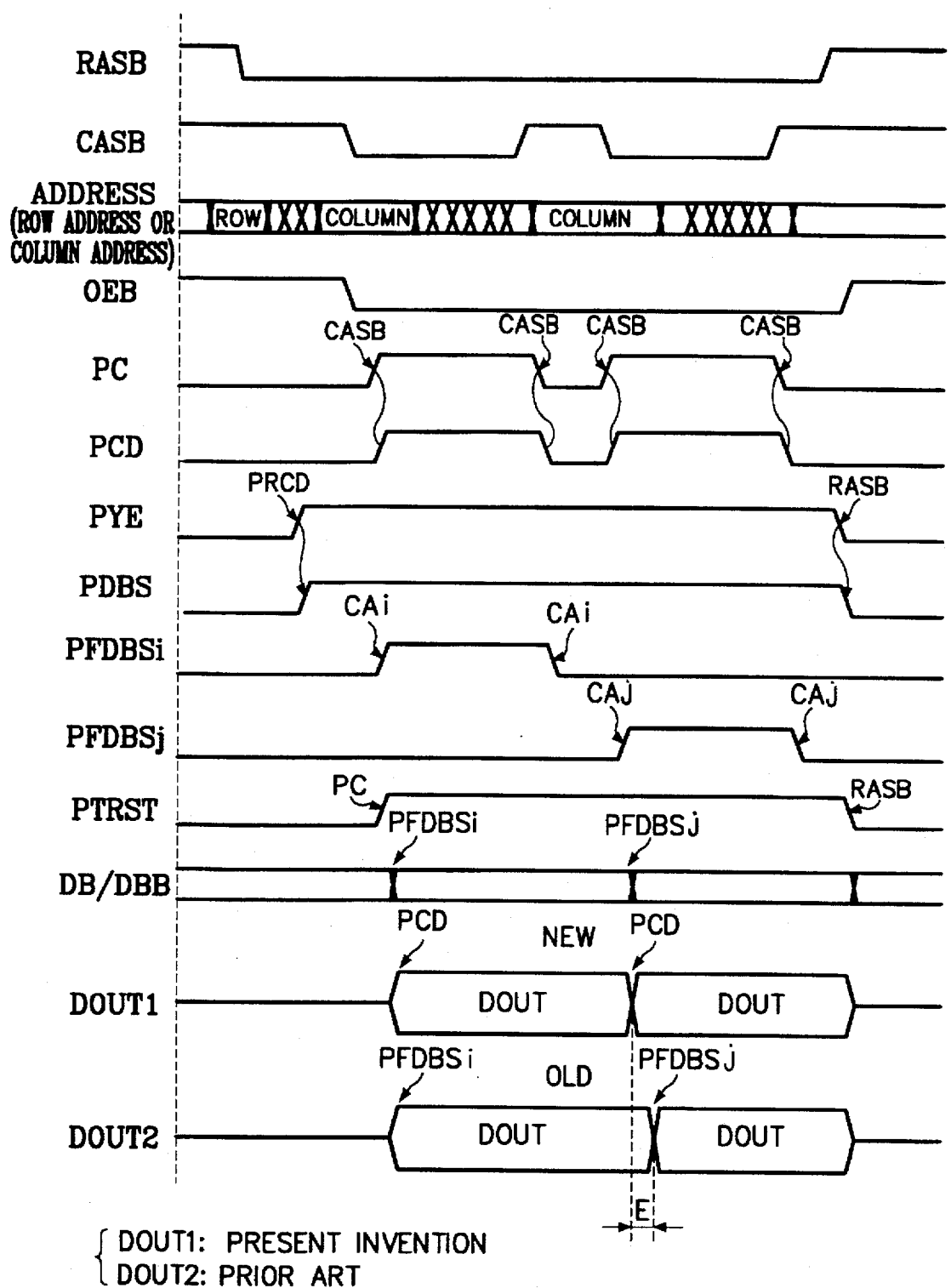
FIGS. 3–4 are timing diagrams illustrating operation of a memory device according to the present invention.

FIG. 3 is a timing diagram illustrating a read cycle for a memory device according to the present invention in an EDO mode. As illustrated, since the gate 46 is controlled by the gate control signals PCD/PCDB responsive to assertion of the CAS signal CASB, a read may be performed in a time period shorter than that of conventional EDO devices, by an interval E.

Figure 4:
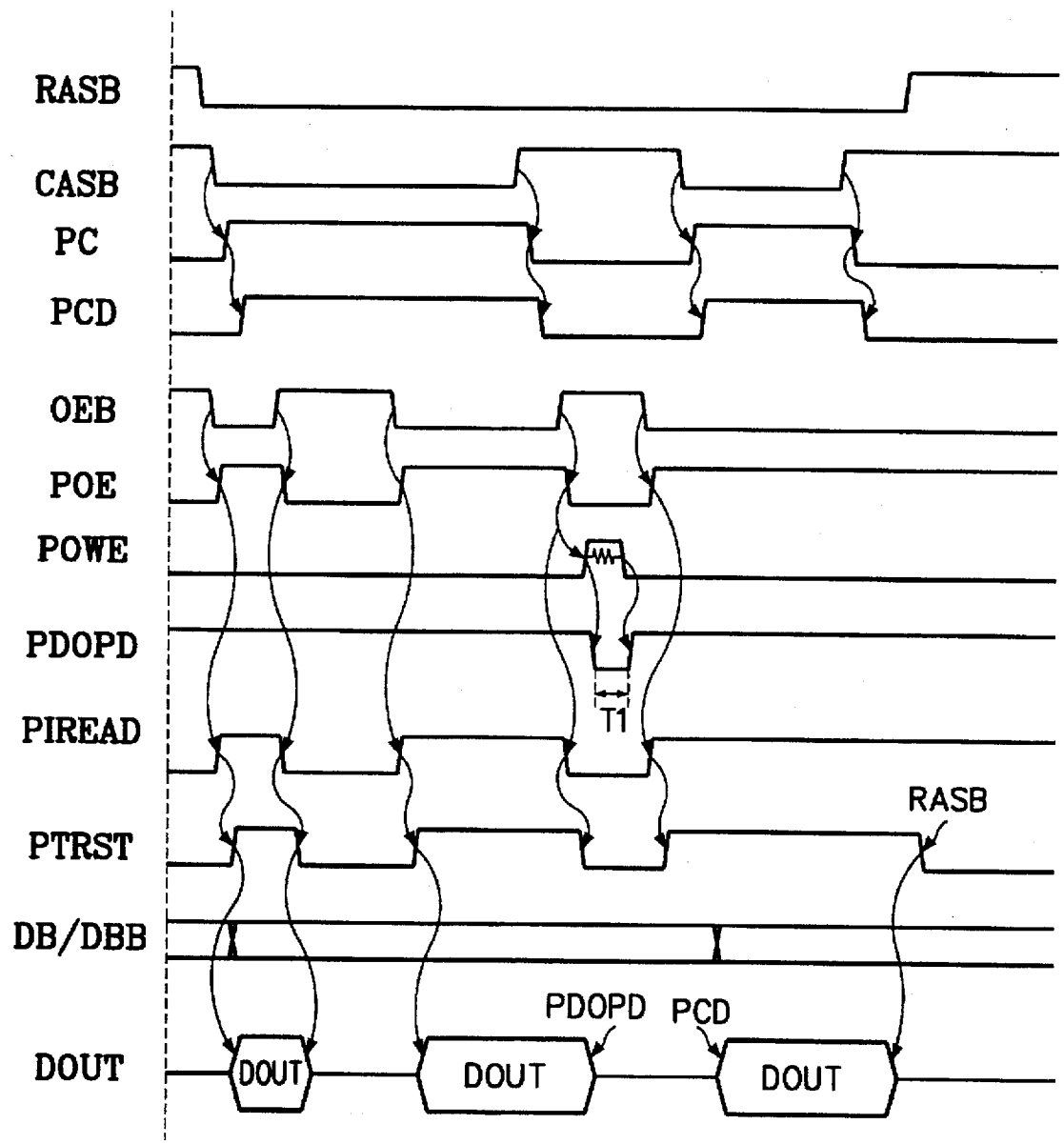

FIG. 4 is a timing diagram illustrating a normal read cycle for a memory device according to the present invention, controlled by an output enable signal OEB. When the control signal PDOPD is at a logic "high" level, data is output at the data output DOUT. When the control signal PDOPD is at a logic "low," the NMOS transistor 1 is turned on, driving the output of the inverter 12 to a ground level.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A memory device, comprising:
   an array of memory cells arranged in a plurality of rows and columns;
   a first data latch which stores data;
   a second data latch which stores data;
   a column address input which receives a column address signal;
   a column address strobe input which receives a column address strobe signal;

first latch control means, responsive to said column address input and to said column address strobe input, for electrically coupling one memory cell in said array of memory cells and said first data latch when a column address signal is asserted at said column address input and for electrically decoupling said one memory cell and said first data latch when a column address strobe signal is asserted at said column address strobe input to thereby latch data present in the one memory cell prior to assertion of the column address strobe signal in the first data latch; and second latch control means, responsive to said column address strobe input, for electrically coupling said first data latch and said second data latch when a column address strobe signal is asserted at said column address strobe input and for electrically decoupling said first data latch and said second data latch when a column address strobe signal is deasserted at said column address strobe input to thereby latch data present in the first data latch prior to deassertion of the column address strobe signal in the second data latch.

2. A memory device according to claim 1, wherein said first latch control means comprises:

a first bit line electrically connected to said one memory cell;

a second bit line;

amplifying means, responsive to said first and second bit lines, for amplifying a voltage between said first and second bit lines to thereby produce an output voltage corresponding to data stored in said one memory cell; and a gate, responsive to said column address input and to said column address strobe input and having an input electrically connected to said amplifying means and an output electrically connected to said first data latch, which electrically couples said amplifying means and said first data latch when a column address signal is asserted at said column address input to thereby transmit said output voltage to said first data latch, and which electrically decouples said amplifying means and said first data latch when a column address strobe signal is asserted at said column address input to thereby latch the output voltage produced by said amplifying means prior to assertion of column address strobe signal.

3. A memory device according to claim 1, wherein said second latch control means comprises:

a gate, responsive to said column address strobe input and having an input electrically connected to said first data latch and an output electrically connected to said second data latch, which electrically couples said first data latch and said second data latch when a column address strobe signal is asserted at said column address strobe input and which electrically decouples said first data latch and said second data latch when the column address strobe signal is deasserted at said column address strobe input.

4. A memory device according to claim 1, further comprising:

a data output; and a data output buffer electrically connected to said second data latch and to said data output and having a data output enable input, the data output buffer electrically coupling said second data latch to said data output when a data output enable signal is asserted at said data output enable input.

5. A method of operating a memory device, the memory device including first and second data latches, an array of memory cells arranged as a plurality of rows and columns, a column address input, a column address strobe input, means for electrically coupling a memory cell in a row of the array of memory cells and the first data latch when a column address signal is asserted at the column address input and for electrically decoupling the memory cell and the first data latch when a column address strobe signal is asserted at the column address strobe input, and means for electrically coupling the first data latch and the second data latch when a column address strobe signal is asserted at the column address strobe input and for electrically decoupling the first data latch and the second data latch when a column address strobe signal is deasserted at the column address strobe input, the method comprising the following steps, performed in the following order:

asserting a first column address signal to electrically couple the first data latch and one memory cell in one row of the array of memory cells;

asserting a column address strobe signal to electrically couple the first data latch and the second data latch and to electrically decouple the one memory cell and the first data latch, thereby latching data present in the one memory cell prior to assertion of the column address strobe signal in the first data latch; and deasserting the column address strobe signal to electrically decouple the first data latch and the second data latch, thereby latching data present in the first data latch prior to deassertion of the column address strobe signal in the second data latch.

6. A method according to claim 5, wherein said step of asserting a column address strobe signal is followed by the step of asserting a second column address signal to electrically couple the first data latch and a second memory cell in the one row of memory cells, and wherein said steps of asserting the second column address signal and deasserting the column address strobe signal is followed by the following steps;

reasserting the column address strobe signal to electrically couple the first data latch and the second data latch and to electrically decouple the second memory cell and the first data latch, thereby latching data present in the second memory cell prior to reassertion of the column address strobe signal in the first data latch; and deasserting the column address strobe signal to electrically decouple the first data latch and the second data latch, thereby latching data present in the first data latch prior to deassertion of the column address strobe signal in the second data latch.

7. A method according to claim 6, wherein said step of reasserting the column address strobe signal is preceded by the step of reading data from the second data latch.

8. A method of operating a memory device, the memory device including first and second data latches, an array of memory cells arranged as a plurality of rows and columns, a column address input, a column address strobe input, means for electrically coupling a memory cell in one row of the array of memory cells and the first data latch when a column address signal is asserted at the column address input and for electrically decoupling the memory cell and the first data latch when a column address strobe signal is asserted at the column address strobe input, and means for electrically coupling the first data latch and the second data latch when a column address strobe signal is asserted at the column address strobe input and for electrically decoupling the first data latch and the second data latch when a column address strobe signal is deasserted at the column address strobe input, the method comprising the following steps, performed in the following order:

asserting a first column address signal to electrically couple one memory cell in one row of the array of memory cells and the first data latch;

asserting a column address strobe signal to electrically couple the first data latch and the second data latch and to electrically decouple the one memory cell and the first data latch, thereby latching data present in the one memory cell prior to assertion of the column address strobe signal in the first data latch;

reading data from the second data latch while continuing to assert the column address strobe signal.

9. A method according to claim 8, wherein the memory device further includes a data output and a data output buffer electrically connected to the second data latch and to the data output and having a data output enable input, the data output buffer electrically coupling the second data latch and the data output when a data output enable signal is asserted at the data output enable input, and:

wherein said step of asserting a column address strobe signal is followed by the step of asserting a data output enable signal at the data output enable input while continuing to assert the column address strobe signal; and wherein said step of reading data from the second data latch comprises the step of reading data from the data output while continuing to assert the column address strobe signal and the data output enable signal.

10. A method according to claim 8, wherein said step of reading data from the second data latch is followed by the following steps, performed in the following order:

deasserting the column address strobe signal to electrically decouple the first data latch and the second data latch;

asserting a second column address signal to electrically couple a second memory cell in the one row of memory cells and the first data latch;

reasserting the column address strobe signal to electrically couple the first data latch and the second data latch and to electrically decouple the second memory cell and the first data latch, thereby latching data present in the second memory cell prior to reassertion of the column address strobe signal in the first data latch; and reading data from the second data latch while continuing to assert the column address strobe signal.

11. A method according to claim 10, wherein the memory device further includes a data output and a data output buffer electrically connected to the second data latch and to the data output and having a data output enable input, the data output buffer electrically coupling the second data latch and the data output when a data output enable signal is asserted at the data output enable input, and:

wherein said step of asserting a column address strobe signal is followed by the step of asserting a data output enable signal at the data output enable input while continuing to assert the column address strobe signal; and wherein said step of reading data from the second data latch comprises the step of reading data from the data output while continuing to assert the column address strobe signal and the data output enable signal.

\* \* \* \* \*